United States Patent [19]
Henderson et al.

[11] Patent Number: 5,338,645
[45] Date of Patent: Aug. 16, 1994

[54] THREE DIMENSIONAL PRINTED CIRCUITS

[75] Inventors: James M. Henderson; Vernon R. Scott, both of Scottsdale; Kenneth C. Cote, Mesa, all of Ariz.

[73] Assignee: Motorola, Inc., Schaumburg, Ill.

[21] Appl. No.: 874,733

[22] Filed: Jun. 16, 1986

[51] Int. Cl.$^5$ .......................... G03C 5/00; G03C 1/00; B23K 9/00
[52] U.S. Cl. ..................... 430/311; 430/495; 430/945; 219/121.62; 219/121.69; 219/121.79; 219/121.84
[58] Field of Search ............ 430/945, 495, 311; 219/121 LH, 121 LJ, 121 LE, 121 LF; 428/209, 901

[56] References Cited

U.S. PATENT DOCUMENTS

| | | | |
|---|---|---|---|
| 3,435,186 | 3/1969 | Roshon, Jr. et al. | 219/121 |
| 4,527,041 | 7/1985 | Kai | 219/121 LN |
| 4,527,082 | 7/1985 | Cline | 310/313 B |
| 4,535,218 | 8/1985 | Krause et al. | 219/121 LH |

FOREIGN PATENT DOCUMENTS

| | | | |
|---|---|---|---|
| 2205606 | 8/1973 | Fed. Rep. of Germany | 219/121 LH |
| 2638474 | 3/1977 | Fed. Rep. of Germany | 430/945 |
| 0056317 | 8/1977 | Japan | 219/121 LJ |
| 0073189 | 4/1984 | Japan | 219/121 LJ |
| 0153591 | 9/1984 | Japan | 219/121 LJ |

OTHER PUBLICATIONS

Techniques of Adjusting Thin- and Thick-Film Resistors in Hybrid Microelectronic Circuits, Awatar Singh, Microelectronics, vol. 15, No. 2, 123–129.

Focused Laser Lithographic System, Becker et al., Applied Optics, vol. 17, No. 7, Apr. 1, 1978, pp. 1069–1071.

Laser Machining of Thin Films and Integrated Circuits, Cohen et al., Bell Systems Technical Journal, Mar. 1968, pp. 385–404.

Laser Exposes PCB's, Decker, Circuits Manufacturing, pp. 11–24, Dec. 1979.

*Primary Examiner*—John E. Kittle
*Assistant Examiner*—Patrick J. Ryan
*Attorney, Agent, or Firm*—Lowell W. Gresham

[57] ABSTRACT

Printed circuits which reside on three dimensional surfaces are disclosed. Using a first technique, a three dimensional surface is formed on a substrate having a high melting point or permitting a high degree of infrared energy transmittance. The surface contains a layer of metalization maintained at a depth of less than two microns. An infrared laser then moves around the surface and selectively vaporizes metalization leaving a desired printed circuit pattern. The remaining metalization is plated to a useable depth. Using a second technique, a fiber optic bundle is machined on one end to mate with the three dimensional surface. The three dimensional surface, metalized and coated with photo resist, resides in intimate contact with this first end. A second end of the cable is flat and resides in intimate contact with two dimensional master photo artwork. A pattern is exposed on the photoresist through the fiber optic bundle, and the metalization is etched using conventional techniques.

2 Claims, 2 Drawing Sheets

THREE DIMENSIONAL PRINTED CIRCUITS

STATEMENT OF GOVERNMENT INTEREST

The invention described herein may be manufactured and used by the Government of the United States of America for Governmental purposes without the payment of royalties thereon or therefor.

Background of the Invention

The present invention relates generally to the fabrication of printed circuits. More specifically, the present invention relates to fabricating printed circuits on three dimensional, non-planar, surfaces.

In conventional techniques for fabricating printed circuits, a substrate having a planar, two dimensional surface is obtained. This surface is then metalized to a desired thickness, and a suitable photo resist material is applied as a coating over the metalization. In the next step a photo mask is placed in contact with the photo resist material, and portions of the photo resist material are exposed to light through the mask. The exposed photo resist material is then developed while the remaining photo resist material is washed away leaving exposed metalization. The exposed metalization is then etched away using a suitable chemical solvent. After etching, the remaining metalization on the substrate forms a desired printed circuit.

Although conventional printed circuit fabrication techniques produce beneficial results when applied to two dimensional, planar surfaces, problems arise from attempting to apply conventional techniques to printed circuits formed on three dimensional, non-planar surfaces. For example, repeatably and precisely aligning the photo mask to a surface which varies in three dimensions may be extremely difficult. Further, maintaining an intimate contact between the photo mask and the photo resist material on the metalized three dimensional surface may be difficult. Additionally, attaching the photo mask to three dimensional surfaces may be more difficult than in the conventional two dimensional situation. As a result of difficulties caused by positioning the photo mask relative to the three dimensional surface, tight tolerances in trace dimensions and spacing between are extremely difficult to maintain.

SUMMARY OF THE INVENTION

Accordingly, it is an object of the present invention to provide printed circuits which reside on three dimensional, non-planar surfaces.

Another object of the present invention concerns providing a method for fabricating printed circuits onto three dimensional surfaces.

Yet another object of the present invention concerns providing three dimensional printed circuits which repeatably exhibit a high resolution in trace dimensions and spacing between traces at a reasonably low cost of manufacture.

The above and other objects and advantages of the present invention are carried out in one form by a printed circuit which is compatible with etching by laser energy. The printed circuit resides on a substrate which has a surface that extends in each of three dimensions. Furthermore, the substrate is made from a material which has a melting point and a radiation transmission characteristic which are sufficiently high so that a pulse of laser energy can vaporize a portion of metalization contained on the surface without harming the substrate.

BRIEF DESCRIPTION OF THE DRAWINGS

A more complete understanding of the present invention may be derived by reference to the detailed description and claims when considered in connection with the accompanying drawings, in which like reference numbers indicate similar features, and wherein:

DETAILED DESCRIPTION OF THE PREFERRED EMBODIMENTS

Figure 1:
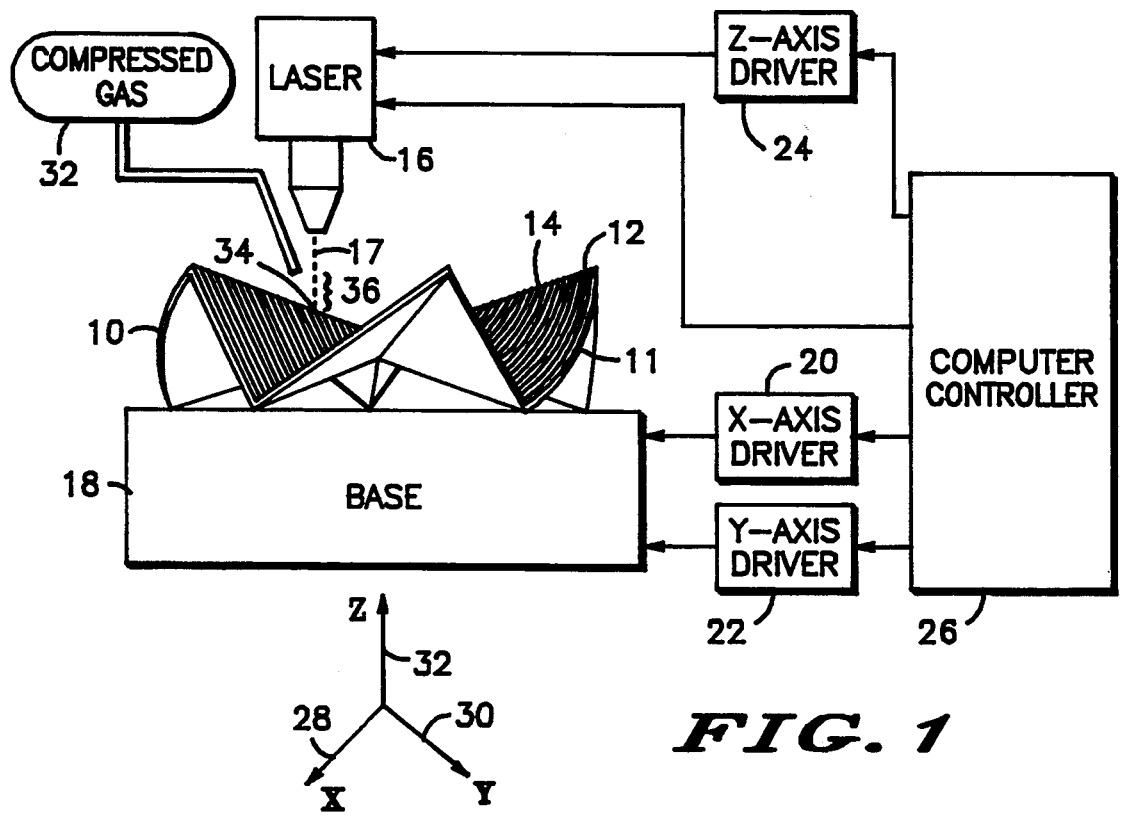
FIG. 1 shows a first embodiment of the present invention.
Figure 2:
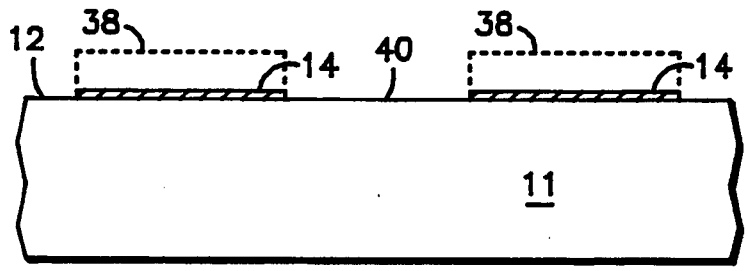
FIG. 2 shows a partial enlarged view of an object portion of the first embodiment of the present invention.

FIGS. 1 and 2 depict a first embodiment of the present invention. Referring to FIG. 1, the present embodiment consists of an object 10 which includes a substrate 11 having a layer of metalization 14 attached to a three dimensional surface 12 thereof. In the present embodiment a laser 16 emits a laser beam 17, or pulse of laser energy, which strikes metalization 14 at a contact point 34 which resides within a focal zone 36 for laser 16. Thus, the laser emits a pulse of laser energy which primarily vaporizes a small portion of metalization 14 away from surface 12 without harming substrate 11.

The present embodiment utilizes a three-axis, computer numerically controlled (CNC) laser welder, such as an SS-500 series Nd:YAG Metalworking Center manufactured by Raytheon. Laser 16, which is a portion of this machine, produces energy at a wave length approximately equal to 1.06 microns when energized. This wave length represents infrared energy. A base 18 represents another portion of the CNC machine. Base 18 physically moves in two dimensions. An X axis driver 20 couples to base 18 and controls movement of base 18 in an X dimension in response to commands from a computer controller 26. Likewise, a Y axis driver 22 couples to base 18 and controls movement of base 18 in a Y dimension in response to controls from computer controller 26. Laser 16 physically moves relative to base 18 in a third dimension. Accordingly, a Z axis driver 24 couples to and controls movement of laser 16 in a Z dimension in response to commands from computer controller 26. FIG. 1 denotes the X, Y and Z dimensions using vectors 28, 30, and 32 respectively. The CNC machine additionally contains a compressed gas container 32 which holds a compressed gas and is arranged so that the compressed gas may exhaust near point of contact 34 when laser 16 operates. Furthermore, computer controller 26 electrically couples to laser 16 to provide a trigger to laser 16 which commands laser 16 to produce a pulse of laser energy.

Substrate 11 represents a non-conductive material. Substrate 11 further exhibits a relatively high dielectric constant because the preferred embodiment is utilized in a microwave antenna application. The removal of metalization 14 from surface 12 of substrate 11 does not harm substrate 11. In other words, the mechanical and electrical properties of substrate 11 do not substantially change as a result of subjecting substrate 11 to laser beam 17. Accordingly, certain parameters of the material used for substrate 11 are coordinated with characteristics of laser beam 17. First, the power level of laser 16 is adjusted so that the strength of laser beam 17 is no greater than is necessary to remove metalization layer 14. In addition, a melting point parameter of substrate 11 is sufficiently high so that substrate 11 can withstand receipt of laser beam 17. Further, an infrared transmittance parameter of substrate 11 is sufficiently high so that a substantial amount of laser energy striking surface 12 of substrate 11 is transmitted through substrate 11 and exits from an opposing boundary of substrate 11 without being absorbed by substrate 11. In accordance with the infrared transmittance parameter of the substrate 11, no fillers are used in this molding process so that the infrared transmittance parameter is maintained as high as possible.

Two plastics which meet the above-mentioned criteria for substrate 11 are polyetheretherkeytone (PEEK) and polysulfone. Each of these plastics have a maximum continuous use temperature specified as being over 400° F. and each are substantially transparent to infrared radiation. However, other plastics, such as acrylic which exhibits a relatively low melting point but is exceptionally transparent to infrared radiation, may be suitable for applications which do not require substrates having high dielectric constants.

Metalization 14 represents a conductive material which is applied to surface 12 of object 10. Metalization 14 is maintained at a relatively uniform and thin depth throughout surface 12. For example, in the preferred embodiment metalization 14 represents either nickel, copper or aluminum which is deposited to a depth of between 0.5 and 2.0 microns. Conventional techniques such as vacuum deposition or sputtering are used to apply metalization 14. Those skilled in the art will recognize that other materials or alloys and other methods of applying metalization 14, such as plating, may be acceptable in particular applications.

A printed circuit is formed on surface 12 of object 10 using the items described above. A computer program for computer controller 26 is written in a manner known to those skilled in the art. This computer program controls the power level of laser 16, the occurrence of trigger signals to laser 16, and the relative movement of base 18 and laser 16. The power level of laser 16 is as low as possible to accomplish the vaporization of the thin layer of metalization 14. This power level may be determined empirically.

The computer program of computer controller 26 first assumes a particular orientation of object 10 relative to base 18. The program controls relative movement between laser 16 and base 18 to achieve two goals. Movement in Z dimension 32 allows laser 16 to remain a desirable distance away from surface 12 of object 10 so that surface 12 is always within focal zone 36 of laser 16. In the preferred embodiment focal zone 36 is approximately 0.1 inch. Thus, movement in the Z dimension permits delivery of a consistent level of energy to various portions of metalization 14. Additional movement in Z dimension 32 and all movement in X and Y dimensions 28 and 30, respectively, permit point of contact 34 to selectively move to any location on surface 12 of object 10.

Laser beam 17 produces pulses of laser energy in response to a received trigger signal rather than a continuous beam of energy. Each pulse of laser energy primarily vaporizes a small point of metalization 14. By sequentially vaporizing connected points of metalization 14, large areas and a wide variety of patterns of metalization 14 may be removed from surface 12 of object 10. Thus, laser 16 operates in the above-described fashion to eventually remove all unwanted metalization 14 from surface 12 so that only a desired pattern remains. This remaining pattern exhibits the pattern desired for the printed circuit formed on surface 12.

The compressed gas assists laser 16 in removing metalization 14. Not all metalization 14 is vaporized. Rather, a small portion of metalization 14 in the vicinity of point of contact 34 will simply melt and flow back toward remaining portions of metalization 14 or form balls. The compressed gas forced into the vicinity of point of contact 14 assists in the removal of metalization 14 from point of contact 34 which may have melted or formed balls rather than vaporized. In the preferred embodiment the gas which is used in compressed gas container 32 is an inert gas, such as a conventional argon-helium mixture. Compressed air or oxygen is not used because such gases tend to promote oxidation of substrate 11, and such oxidation may harm substrate 11.

After laser 16, under computer program control, has etched away all unwanted portions of metalization 14, useable printed circuit traces may be formed by plating onto metalization 14. Referring to FIG. 2, an enlarged portion of object 10 is shown after portions of metalization 14 have been removed from surface 12 of substrate 11. For example, metalization 14 has been removed from area 40 of object 10. Since metalization 14 is maintained at a relatively thin depth on surface 12, surface 12 is typically not immediately suitable for use as a printed circuit. Accordingly, in the preferred embodiment a conductive material, such as a tin-lead alloy 38, is electroplated on top of metalization 14 after etching until a desired depth is achieved for printed circuit traces. In the preferred embodiment such a desired depth is typically 0.001 to 0.003 inch. Other intermediate metals may be plated on top of metalization 14 prior to plating on tin-lead 38 to promote adhesion.

Figure 3:
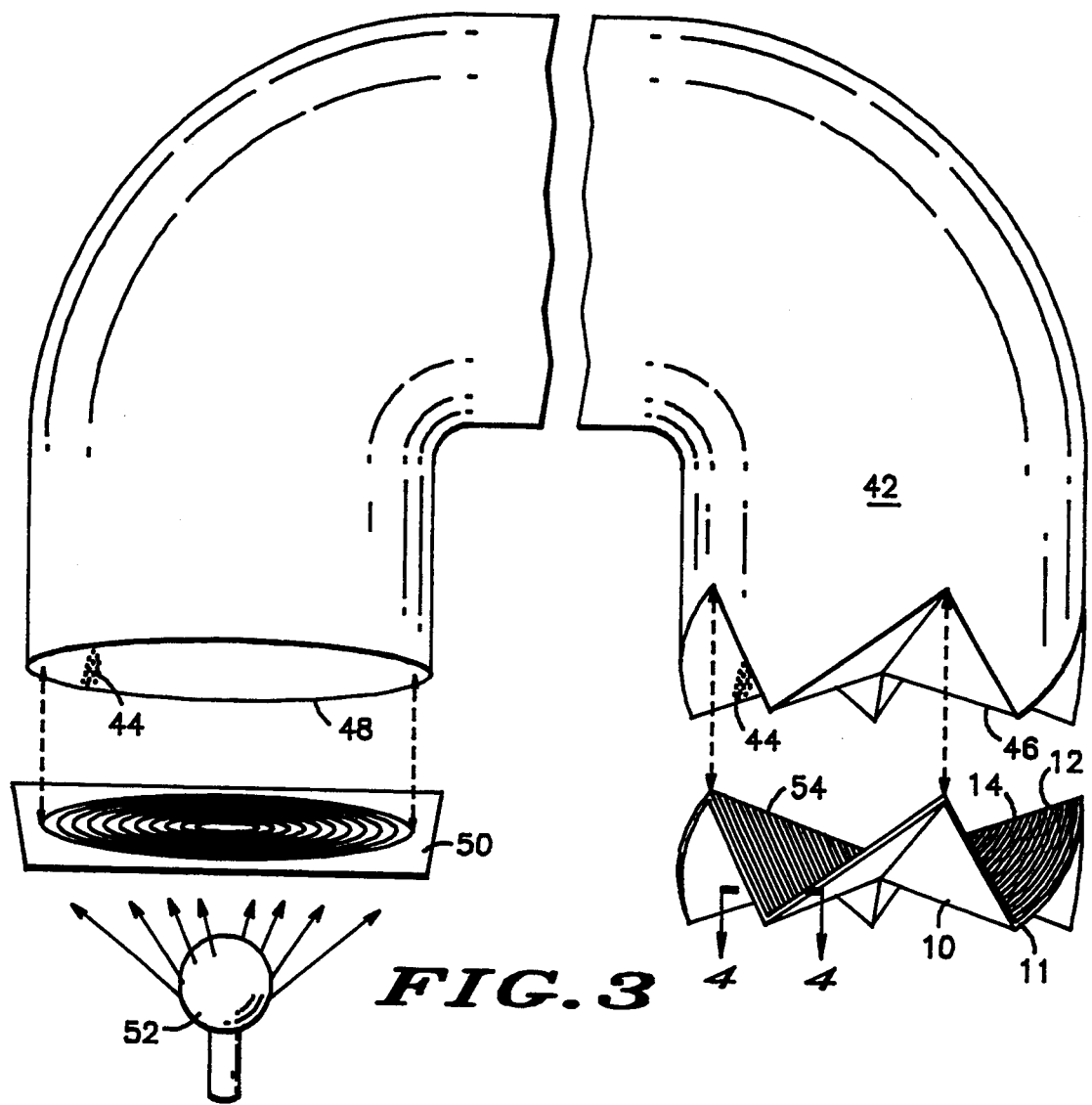
FIG. 3 shows a second embodiment of the present invention.
Figure 4:
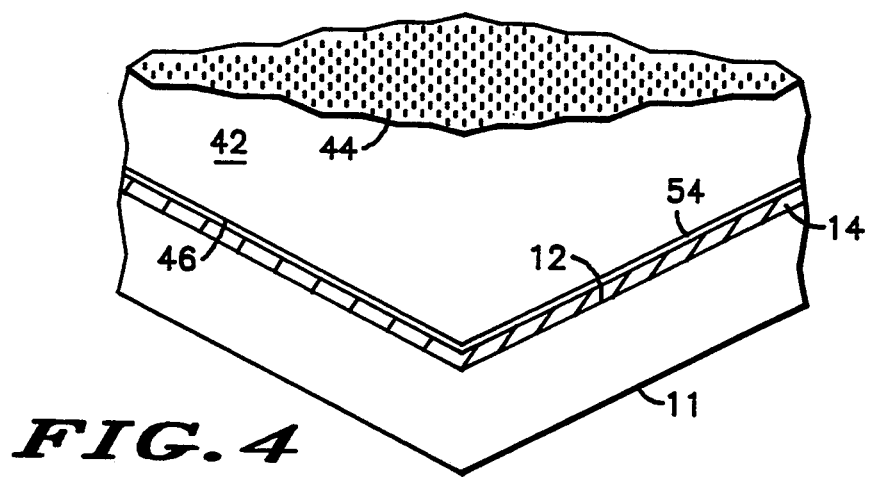
FIG. 4 shows a partial enlarged view of the second embodiment of the present invention taken along line 4—4 from FIG. 3.

FIGS. 3 and 4 depict a second embodiment of the present invention. Referring to both FIGS. 3 and 4, object 10 contains substrate 11, and substrate 11 has a three dimensional, non-planar, surface 12. In this second embodiment substrate 11 represents a non-conductive, high dielectric material. A plastic which can be molded into a desired three dimensional shape may advantageously serve as substrate 11 so long as conductivity and dielectric criteria are met. Layer of metalization 14 resides on surface 12 of substrate 11. In the present embodiment metalization layer 14 exhibits a conventional depth rather than the thin layer of metalization described above in connection with FIGS. 1 and 2. Such a conventional depth may advantageously be in the range of 0.001 to 0.003 inch. A photoresist 54 resides on metalization 14 on the opposing side of metalization 14 from three dimensional surface 12 of substrate 11. Photo resist 54 represents a conventional photo resist which may be used in fabrication of two dimensional printed circuits.

A fiber optic bundle 42 has a first end 46 and a second end 48. A multiplicity of optic fibers are contained within bundle 42 and extend from first end 46 to second end 48. Each of fibers 44 within bundle 42 transmits light from one end of bundle 42 to the other end of bundle 42. No substantial leakage of the light occurs until light emerges from an end of bundle 42. Additionally, substantially no bleeding of light from one fiber into another fiber occurs, and the multiplicity of fibers are routed substantially parallel to each other. In the present embodiment fibers 44 are as small in diameter as is practically possible. Smaller diameter fibers produce finer resolution traces and spacing between traces.

First end 46 of bundle 42 exhibits a three dimensional surface which corresponds to the three dimensional shape of surface 12 from substrate 11. Thus, first end 46 mates with, or may be brought into intimate contact with, photo resist 54 which resides on metalization 14 and substrate 11. The ends of substantially all of fibers 44 contained within bundle 42 at first end 46 physically contact photo resist 54 when bundle 42 mates with object 10.

First end 46 of bundle 42 may be formed into the desired three dimensional shape by machining. In fact, first end 46 may advantageously serve as a master pattern for a mold from which subsequent substrates 11 are molded. Using end 46 as a master pattern will insure an intimate contact between fibers 44 and surface 12 of substrate 11.

Referring only to FIG. 3, second end 48 of bundle 42 represents a substantially planar, two dimensional surface which resides substantially perpendicular to an axial dimension of bundle 42. A master photo artwork 50 resides adjacent to and in intimate contact with second end 48 of bundle 42. Master photo artwork 50 contains a negative of the printed circuit pattern to be formed on surface 12 of object 10. It represents a conventional type of master artwork which is used in two dimensional printed circuit fabrication and is not discussed in detail herein. Artwork 50 maintains an intimate contact with end 48, and is aligned in a predetermined relationship with bundle 42. A light source 52 resides on an opposing side of artwork 50 from bundle 42 and is positioned so that light produced by light source 52 strikes artwork 50.

In this second embodiment of the present invention, light produced by light source 52 strikes artwork 50 and is partially blocked and partially transmitted by artwork 50 into fiber optic bundle 42. The portions of the light blocked and transmitted by artwork 50 are defined by a pattern contained on artwork 50. The transmitted portion of the light enters individual ones of fibers 44 at first end 48 of bundle 42 and is transmitted to second end 46 of bundle 42. Substantially no light enters other individual ones of fibers 44 where such fibers are blocked by the mask defined in artwork 50. Light from the individual fibers into which light was transmitted at artwork 50 emerges from first end 46 of bundle 42 and exposes photo resist 54. Only areas of photo resist 54 which reside in intimate contact with the particular fibers 44 which are transmitting light will be exposed. Since intimate contact is maintained between bundle 42 and artwork 50 at second end 48 and between bundle 42 and photo resist 54 at first end 46, substantially no blurring occurs between areas of photo resist 54 which are exposed to light and those which are not exposed.

Object 10, bundle 42, artwork 50 and light source 52 are maintained in the relative positions described above until exposure of photo resist 54 is completed. The present invention maintains a compatibility between fibers 44, bundle 42, photo resist 54, and the light emitted from light source 52. Fibers 44 must be capable of transmitting light at the wave length which is exhibited by light emitted from light source 52 and transmitted by artwork 50. In addition, this particular wave length of light must also be capable of exposing photo resist 54. If incompatibilities exist in the wave length of light emitted, transmitted, or exposed to photo resist 54, the time required for maintaining object 10, bundle 42, artwork 50, and light source 52 in their respective positions may be lengthened to permit a sufficient exposure of photo resist 54.

Once photo resist 54 has been exposed, photo resist 54 may be developed and metalized surface 14 may be etched using conventional printed circuit fabrication techniques, such as chemical etching, which are known to those skilled in the art of manufacturing two dimensional printed circuits.

The foregoing description uses preferred embodiments to illustrate the present invention. However, those skilled in the art of manufacturing conventional two dimensional printed circuits will recognize that changes and modifications may be made in these embodiments without departing from the scope of the present invention. For example, those skilled in the art will recognize that materials other than those described above may be substituted for the above-described materials in various particular applications. Additionally, the properties of the above-described materials and the dimensions associated with the above-described materials are subject to a wide variation. Further, other types of lasers, such as $CO_2$ lasers, may be used by the present invention. Additionally, those skilled in the art will recognize that a wide variation in both printed circuit patterns and three dimensional surfaces may be accommodated by the embodiments described above. These and other changes and modifications obvious to those skilled in the art are intended to be included within the scope of this invention.

We claim:

1. A method of fabricating a printed circuit, said method comprising the steps of:

providing a non-conductive substrate which transmits radiation having a wavelength equivalent to the wavelength of energy by a laser, and the substrate having a surface;

depositing a conducting material on the surface of the substrate so that the material maintains a depth of less than 2 microns on the surface;

adjusting a power level and a position of the laser relative to the surface of the substrate so that a pulse of laser energy produced by energizing the laser vaporizes conductive material from the substrate without harming the substrate;

moving the laser and the substrate relative to one another in a predetermined pattern so that the surface of the substrate continuously resides in a focal zone of the laser;

selectively energizing the laser in coordination with said moving step to vaporize portions of conductive material from the substrate; and plating additional conductive material to the conductive material remaining on the substrate after said moving and selectively energizing steps.

2. A method of fabricating a printed circuit as claimed in claim 1, wherein said providing step comprises the step of forming the substrate so that the surface is non-planar.

* * * * *